United States Patent
Bhagavat et al.

(10) Patent No.: US 8,058,144 B2
(45) Date of Patent: Nov. 15, 2011

(54) METHOD FOR CAPPING A MEMS WAFER

(75) Inventors: Milind Bhagavat, Medford, MA (US);
Erik Tarvin, South Boston, MA (US);
Firas Sammoura, Melrose, MA (US);
Kuang Yang, Newton, MA (US);
Andrew Sparks, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 73 days.

(21) Appl. No.: 12/468,185

(22) Filed: May 19, 2009

(65) Prior Publication Data

US 2009/0294879 A1   Dec. 3, 2009

Related U.S. Application Data

(60) Provisional application No. 61/057,261, filed on May 30, 2008.

(51) Int. Cl.
*H01L 21/46* (2006.01)
*C03B 29/00* (2006.01)

(52) U.S. Cl. ............. 438/456; 156/89.11; 65/31; 65/36; 65/42; 65/43; 65/58

(58) Field of Classification Search .......... 438/455–459; 65/31, 36, 42, 43, 58, 60.1–60.8; 156/89.11
See application file for complete search history.

(56) References Cited

U.S. PATENT DOCUMENTS

| | | | |
|---|---|---|---|
| 6,621,158 B2 * | 9/2003 | Martin et al. | 257/704 |
| 6,815,071 B2 | 11/2004 | Baney et al. | |
| 7,364,942 B2 | 4/2008 | Martin | |
| 2001/0034076 A1 * | 10/2001 | Martin | 438/50 |
| 2003/0073292 A1 * | 4/2003 | Bartlett et al. | 438/458 |
| 2005/0058841 A1 * | 3/2005 | Baney et al. | 428/428 |
| 2007/0238262 A1 * | 10/2007 | Summers | 438/455 |
| 2008/0003436 A1 * | 1/2008 | Haack et al. | 428/426 |

* cited by examiner

*Primary Examiner* — Michael Lebentritt
*Assistant Examiner* — Karen Kusumakar
(74) *Attorney, Agent, or Firm* — Sunstein Kann Murphy & Timbers LLP

(57) ABSTRACT

A method for capping a MEMS wafer to form a hermetically sealed device. The method includes applying a glass bonding agent to the cap wafer and burning off organic material in the glass bonding agent. The cap wafer/glass bonding agent combination is then cleaned to reduce lead in the combination. The cleaning is preferably accomplished using an oxygen plasma. The MEMS device is coated with a WASA agent. The cap wafer is then bonded to the MEMS wafer by heating this combination in a capping gas atmosphere of hydrogen molecules in a gas such as nitrogen, argon or neon. This method of capping the MEMS wafer can reduce stiction in the MEMS device.

15 Claims, 2 Drawing Sheets

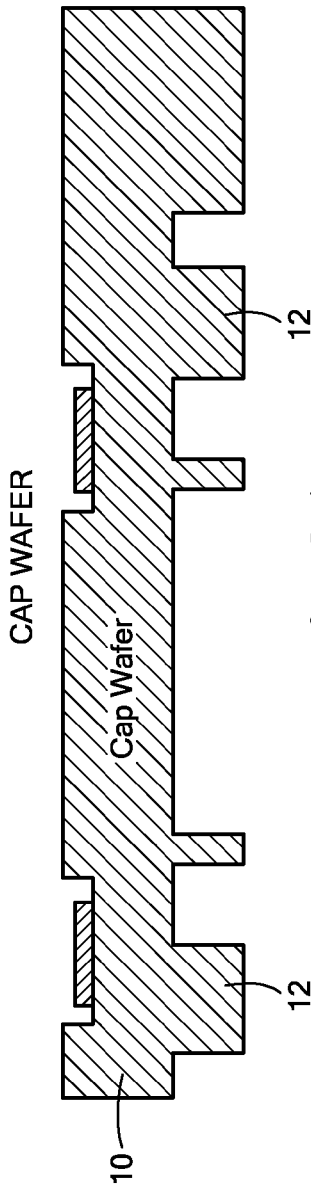
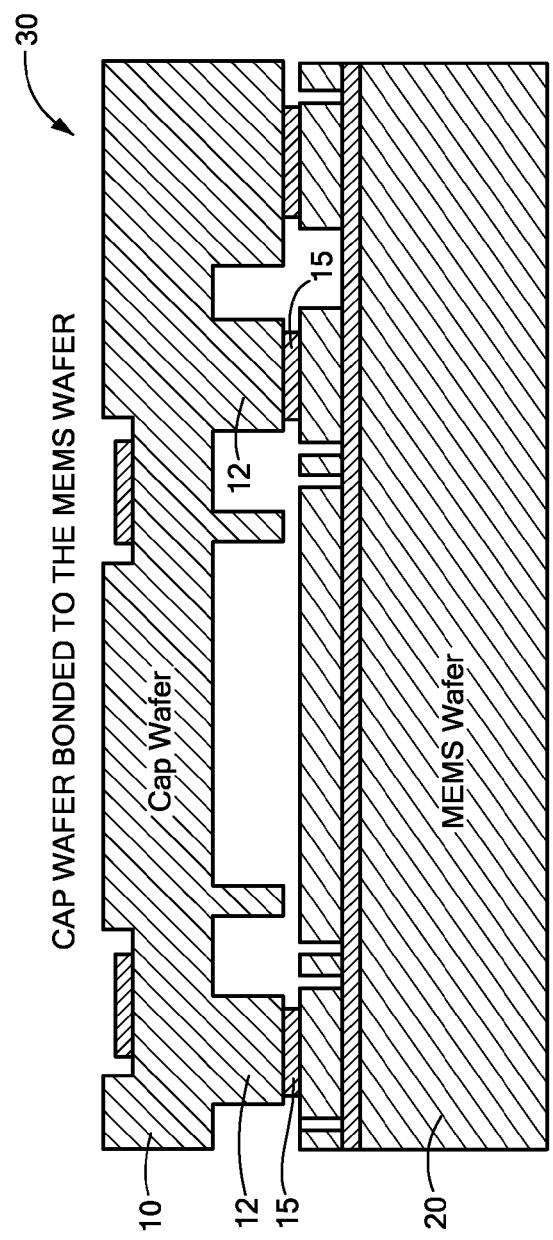

METHOD FOR CAPPING A MEMS WAFER

This application claims priority from U.S. provisional patent application Ser. No. 61/057,261, filed May 30, 2008, which is incorporated herein by reference.

TECHNICAL FIELD

The present invention relates to methods for forming hermetically sealed packages for microelectromechanical system ("MEMS") devices, and more particularly to sealing methods that reduce stiction in MEMS devices.

BACKGROUND OF THE INVENTION

Generally speaking, a microelectromechanical system ("MEMS") is a highly miniaturized device having both electrical and mechanical components. MEMS devices are typically fabricated on or from a substrate material, such as silicon or polysilicon. Various electrical and mechanical structures are formed in the MEMS using a variety of techniques.

The mechanical structures of the MEMS are typically very fragile, and can be easily damaged. Furthermore, the mechanical structures of the MEMS are typically very sensitive, and can be easily impeded. Stiction, which is a surface adhesion force that tends to prevent relative motion between two moveable parts of the MEMS device, can be a particular problem both during device fabrication as well as in use over the lifetime of the device. Various techniques have been used to reduce stiction including coating the MEMS structures with a wafer anti-stiction agent ("WASA"), such as an organic material. For example, U.S. Pat. No. 5,694,740 to Martin et al., which is expressly incorporated by reference herein in its entirety, describes such techniques. Further, U.S. Pat. No. 7,364,942 to Martin, which is expressly incorporated by reference herein in its entirety, also describes such techniques.

Many factors can affect MEMS performance, including dirt, moisture, and even static electricity. Therefore, a cap is typically placed over substantially all of the MEMS mechanical components in order to protect the mechanical components of the MEMS device. The cap typically includes a cavity to allow the MEMS structures to move while simultaneously protecting the structures from the operating ambient. The cap is bonded onto the MEMS in such a way that the MEMS structures to be protected are positioned within the MEMS cavity. This bond is often formed so that the device is hermetically sealed against contaminants.

SUMMARY OF THE INVENTION

In embodiments of the present invention, a method is provided for bonding a cap wafer to a MEMS wafer, which includes a microstructure, to form a hermetic seal. A glass bonding agent is applied to surfaces of the cap wafer which will contact the MEMS wafer. Organic material in the bonding agent is then burned off by heating the cap wafer. The cap wafer/bonding agent combination is then cleaned to remove lead impurities, such as by using oxygen plasma or another cleaning method. The cap wafer is then aligned with and brought into contact with the MEMS wafer with the glass bonding agent forming a contact region between the two wafers. The cap wafer/MEMS wafer combination is then heated in a capping gas to melt the bonding agent, forming a hermetically sealed cavity between the wafers. This cavity contains the MEMS microstructure. The capping gas contains a mixture of hydrogen with another gas or gasses that are inert, such as nitrogen, argon or neon. The pressure and temperature in the bonder together with the concentration of hydrogen molecules in the capping gas mixture are chosen so that the percentage of hydrogen molecules in the gas mixture in the sealed cavity at 20 degrees centigrade after bonding multiplied by the cavity pressure, measured in atmospheres, is greater than 1. This method of capping the MEMS wafer can advantageously reduce stiction in the MEMS device.

In various embodiments of the invention, a WASA may be applied to movable microstructures in the MEMS wafer, before the cap is bonded to the MEMS wafer. In other embodiments, the percentage of oxygen molecules in the capping gas is less than 0.25 percent.

BRIEF DESCRIPTION OF THE DRAWINGS

The foregoing features of the invention will be more readily understood by reference to the following detailed description, taken with reference to the accompanying drawings, in which:

FIG. 2A is a cross-sectional view of a cap wafer used in the process of FIG. 1; and FIG. 2B is a cross-sectional view of a MEMS device package produced in the process of FIG. 1.

DETAILED DESCRIPTION OF SPECIFIC EMBODIMENTS

Figure 1:
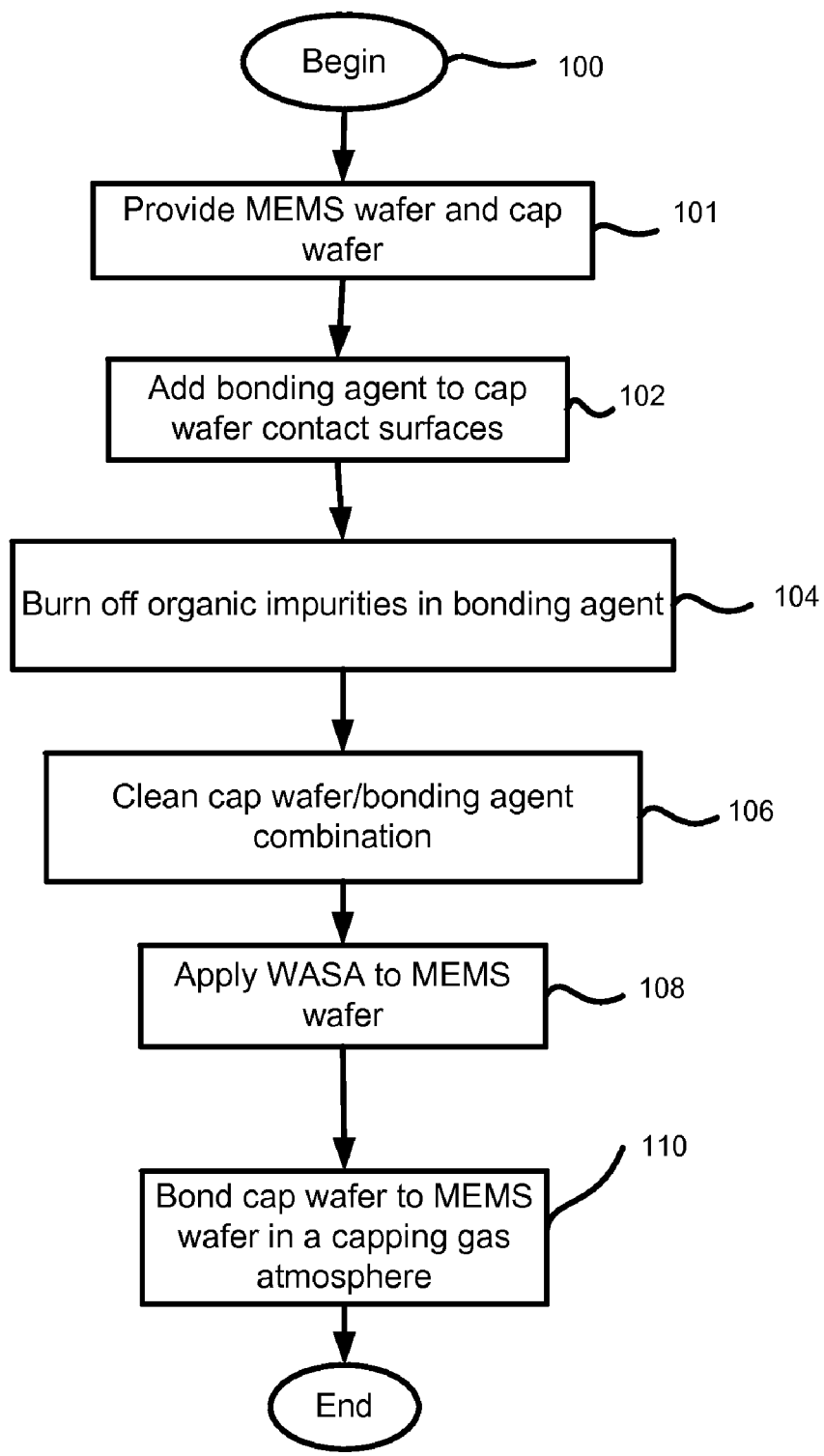
FIG. 1 is flow diagram of a process for capping a MEMS wafer, according to an embodiment of the invention.

Definitions: As used in this description and the accompanying claims, unless the context otherwise requires, a "percentage of a gas" in a gas mixture shall mean the ratio of the number of molecules of the given gas in a volume to the total number of gas molecules in the volume, multiplied by 100 percent.

In embodiments of the present invention, a process is provided for capping a MEMS wafer such that stiction in MEMS device structures is reduced. A glass bonding agent is added to a cap wafer on cap wafer surfaces that will contact the MEMS wafer. After the organic impurities in the bonding material are burned off, the cap wafer/bonding agent is subjected to a further cleaning process to remove other impurities in the bonding material, such as lead. For example, the cap wafer/bonding agent may be cleaned with an oxygen plasma. A WASA is used to coat the MEMS structures and the cleaned cap wafer/bonding agent combination is then bonded to the MEMS wafer in a substantially oxygen-free capping gas atmosphere. This process forms a hermetically sealed cavity between the cap wafer and the MEMS wafer, containing a microstructure. The pressure and temperature in the bonder together with the percentage of hydrogen molecules in the capping gas mixture are chosen so that the percentage of hydrogen molecules in the gas mixture in the sealed cavity at 20 degrees centigrade after bonding multiplied by the cavity pressure, measured in atmospheres, is greater than 1. In preferred embodiments of the invention, the capping gas contains less than 0.25% oxygen.

FIG. 1 is a flow diagram for a method 100 of capping a MEMS wafer according to an embodiment of the invention. FIG. 2A shows a cross-section of a cap wafer 10 that may be used to cap a MEMS wafer 20, according to the process shown in FIG. 1. The cap wafer 10 includes contact surfaces 12 which bond to corresponding surfaces on the MEMS wafer 20 to seal the MEMS device 30, as shown in FIG. 2B 101. The cavity formed by the bonded cap wafer and MEMS wafer contains a MEMS microstructure.

The MEMS device 30 may implement any conventionally known functionality commonly implemented on a MEMS device, such as an inertial sensor. For example, the MEMS device 30 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Although the packaged MEMS device 30 is discussed above as an inertial sensor, principles of illustrative embodiments can apply to other MEMS devices, such as pressure sensors and microphones. Accordingly, discussion of an inertial sensor is exemplary and not intended to limit the scope of various embodiments of the invention.

A glass bonding agent is applied 102 to the cap wafer 10 on surfaces 12 that will contact the MEMS wafer 20. In an illustrative embodiment of the present invention, the bonding material 15 is a glass material that is formed by screen printing a glass frit onto the cap wafer contact surfaces 12. The glass frit is subjected to about 350 degrees centigrade for about an hour to burn off the organic binder materials 104. The glass material is then consolidated by melting it for approximately 10 minutes at 420 degrees centigrade in clean, dry air. Glass is a good bonding material because it can provide a hermetic seal and is not electrically conductive.

The cap/bonding agent combination is then cleaned 106 to remove traces of lead. In a preferred embodiment of the invention, the combination is cleaned with oxygen plasma. The cap wafer/bonding agent combination is cleaned in a downstream batch oxygen plasma ashing system. The oxygen plasma is created with a 2000 standard centimeter cube per minute ("sccm") oxygen flow ionized with 1000 Watts power at 1 mbar operating pressure. The cleaning process is performed, for example, for 2 hours on a batch of up to 23 cap wafers. A WASA is then applied 108 to the MEMS wafer. Cleaning the cap wafer/bonding agent with oxygen plasma converts most of the elemental lead traces in the bonding agent into lead oxide. (These elemental lead traces were likely formed in the organic burn-off process.) Note that the operating parameters described above are by way of illustration and not by way of limitation.

In other embodiments of the invention, other methods of cleaning the cap/bonding agent combination to remove lead, as are known in the art, may be employed. For example, the cap wafer/bonding agent combination may be wet etched to remove free lead from the surface of the combination. Etchants may include tetra methyl ammonium hydroxide ("TMAH") or ethylenediaminetetraacetic acid ("EDTA"). The inventors believe that cleaning the cap wafer/bonding agent combination with oxygen plasma provides a more manufacturable process, however.

In a preferred embodiment of the invention, bonding the cap wafer to the MEMS wafer is completed in a commercially available wafer bonding system. In order to bond the cap structure onto the MEMS structure, the cap and MEMS wafers are aligned, brought into contact and subjected to a temperature of about 440 degrees centigrade in a capping gas mixture at 2000 mbar (about 2 atmospheres) for approximately 10 minutes, where the concentration of hydrogen molecules in the capping gas is in the range from 2% to 6%. The bonding agent melts, forming a hermetically sealed cavity between the cap wafer and MEMS wafer 110. In another preferred embodiment of the invention, the capping gas is a mixture of hydrogen at a concentration of greater than 2% and less than 6% mixed with inert gasses such as one or more of nitrogen, argon or neon. The concentration of oxygen molecules in the capping gas is preferably less than 0.25%.

In other embodiments of the invention, the bonding pressure and temperature and the concentration of hydrogen molecules in the capping gas may vary. Any combination of temperature and pressure may be used in the bonder such that the bonding agent melts, forming a hermetic seal. The pressure and temperature in the bonder together with the concentration of hydrogen molecules in the capping gas mixture are chosen so that the percentage of hydrogen molecules in the sealed cavity at 20 degrees centigrade after bonding multiplied by the cavity pressure, measured in atmospheres, is greater than 1. This combination of pressure and hydrogen molecule concentration in the gas mixture in the sealed cavity will advantageously reduce stiction in the MEMS device microstructure.

Conventional wafer bonding processes require oxygen in the bonding atmosphere to oxidize lead impurities in the glass bonding agent left by the organic burn-off process. In embodiments of the present invention, lead impurities are substantially removed from the glass bonding agent prior to bonding the cap wafer to the MEMS wafer. For example, cleaning the cap wafer/glass bonding agent combination with oxygen plasma performs this function by oxidizing lead impurities. A capping gas mixture with substantial hydrogen and minimal oxygen may then be used in the bonder. Reduction of oxygen in the capping gas atmosphere may reduce disturbance of any WASA coating on the MEMS structures. WASA disturbance may occur from the oxygen present in a conventional capping atmosphere. Thus, the WASA coating may be more effective in reducing stiction, in various embodiments of the invention. In embodiments of the invention, this bonding process can also control moisture in the capped wafer. Better moisture control may lead to stiction reduction. This bonding process also provides hydrogen inside the capped device to help maintain the MEMS structures' surfaces as hydrophobic, even if there is any WASA degradation. The hydrogen may help repair gasses that form in the WASA material. In addition, the hydrogen passivated surfaces are less susceptible to surface charging leading to further reduction in stiction. This has a significant effect on electrical performance of the MEMS devices such as accelerometers and gyroscopes. Thus, stiction in MEMS devices may be reduced by one or more of these effects.

The embodiments of the invention described above are intended to be merely illustrative; numerous variations and modifications will be apparent to those skilled in the art. Temperatures, pressures, times, and other variables described above for the various steps in this method are illustrative only and may be varied in various embodiments of the invention. All such variations and modifications are intended to be within the scope of the present invention as defined in the appended claims.

What is claimed is:

1. A method for bonding a cap wafer to a MEMS wafer to form a hermetically sealed cavity between the cap wafer and the MEMS wafer, comprising:
   a. applying a glass bonding agent to the cap wafer and removing organic material in the glass bonding agent;
   b. cleaning the cap wafer/glass bonding agent combination with an oxygen plasma to remove lead; and
   c. bonding the cap wafer to the MEMS wafer including:
      (i) bringing the cap wafer/glass bonding agent combination into contact with the MEMS wafer, the glass bonding agent forming the bond between the cap wafer and the MEMS wafer; and (ii) heating the cap wafer/MEMS wafer combination in a capping gas atmosphere at a given temperature and a given pressure such that the percentage of hydrogen molecules in the sealed cavity after bonding, when the temperature of the cavity equals 20 degrees centigrade, multiplied by the cavity pressure, measured in atmospheres, is greater than 1.

2. A method according to claim 1, wherein cleaning the cap wafer/glass bonding agent combination includes applying the oxygen plasma to the combination for at least one hour.

3. A method according to claim 1, wherein cleaning the cap wafer/glass bonding agent combination includes applying a wet etchant.

4. A method according to claim 3, wet etchant includes at least one of TMHA and EDTA.

5. A method according to claim 1 further including:
applying a wafer anti-stiction agent to the MEMS wafer prior to bonding the cap wafer to the MEMS wafer.

6. A method according to claim 1, wherein the capping gas atmosphere includes nitrogen.

7. A method according to claim 1, wherein the capping gas atmosphere includes argon.

8. A method according to claim 1, wherein the capping gas atmosphere includes neon.

9. A MEMS device formed by the method of claim 1.

10. A method for bonding a cap wafer to a MEMS wafer to form to form a hermetically sealed cavity between the cap wafer and the MEMS wafer comprising:

a. applying a glass bonding agent to the cap wafer;
b. cleaning the cap wafer/glass bonding agent combination with an oxygen plasma; and
c. bonding the cap wafer to the MEMS wafer including:
(i) bringing the cap wafer/glass bonding agent combination into contact with the MEMS wafer, the glass bonding agent forming the bond between the cap wafer and the MEMS wafer; and
(ii) heating the cap wafer/MEMS wafer combination in a capping gas atmosphere that includes less than 0.25 percent oxygen molecules at a given temperature and a given pressure such that the percentage of hydrogen molecules in the sealed cavity after bonding, when the temperature of the cavity equals 20 degrees centigrade, multiplied by the cavity pressure, measured in atmospheres, is greater than 1.

11. A method according to claim 10 further including:
applying a wafer anti-stiction agent to the MEMS wafer prior to bonding the cap wafer to the MEMS wafer.

12. A method according to claim 10, wherein the capping gas atmosphere includes nitrogen.

13. A method according to claim 10, wherein the capping gas atmosphere includes argon.

14. A method according to claim 10, wherein the capping gas atmosphere includes neon.

15. A MEMS device formed by the method of claim 10.

* * * * *

UNITED STATES PATENT AND TRADEMARK OFFICE
CERTIFICATE OF CORRECTION

PATENT NO. : 8,058,144 B2  
APPLICATION NO. : 12/468185  
DATED : November 15, 2011  
INVENTOR(S) : Milind Bhagavat et al.

Page 1 of 1

It is certified that error appears in the above-identified patent and that said Letters Patent is hereby corrected as shown below:

In Col. 5, lines 28-29, claim 10  
replace "to form to form a hermetically sealed cavity"  
with --to form a hermetically sealed cavity--

Signed and Sealed this  
Third Day of April, 2012

David J. Kappos  
*Director of the United States Patent and Trademark Office*